(12) United States Patent
Lee et al.

(10) Patent No.: US 9,181,091 B2
(45) Date of Patent: Nov. 10, 2015

(54) POROUS NANOSTRUCTURE AND METHOD OF MANUFACTURING THE SAME

(75) Inventors: Eun-kyung Lee, Seoul (KR);
Dong-mok Whang, Seoul (KR);
Byoung-lyong Choi, Seoul (KR);
Sun-hwak Woo, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 392 days.

(21) Appl. No.: 12/959,501

(22) Filed: Dec. 3, 2010

(65) Prior Publication Data
US 2011/0133153 A1 Jun. 9, 2011

(30) Foreign Application Priority Data

Dec. 8, 2009 (KR) ........................ 10-2009-0121410

(51) Int. Cl.
| | | |
|---|---|---|
| H01L 21/00 | (2006.01) |
| B82Y 40/00 | (2011.01) |
| B82Y 10/00 | (2011.01) |
| H01L 29/06 | (2006.01) |
| H01L 31/0352 | (2006.01) |
| B82Y 30/00 | (2011.01) |

(52) U.S. Cl.
CPC ............... *B82Y 40/00* (2013.01); *B82Y 10/00* (2013.01); *H01L 29/0665* (2013.01); *H01L 31/035209* (2013.01); *H01L 31/035227* (2013.01); *B82Y 30/00* (2013.01)

(58) Field of Classification Search
CPC ........ B82Y 40/00; B82Y 10/00; B82Y 30/00; H01L 31/035227; H01L 29/0665; H01L 31/035209

USPC ........................................... 257/9, 8; 977/762
See application file for complete search history.

(56) References Cited

U.S. PATENT DOCUMENTS

| | | | |
|---|---|---|---|
| 6,548,313 B1* | 4/2003 | Ravi et al. ................. | 438/6 |
| 7,045,205 B1* | 5/2006 | Sager ......................... | 428/304.4 |
| 7,074,480 B2* | 7/2006 | Fukutani et al. ........... | 428/312.2 |
| 7,419,601 B2* | 9/2008 | Cooper et al. .............. | 210/679 |
| 7,553,371 B2* | 6/2009 | Dubrow et al. ............. | 117/90 |
| 7,634,162 B2* | 12/2009 | Kempa et al. .............. | 385/33 |
| 7,763,228 B2* | 7/2010 | Oya et al. ................... | 423/447.1 |
| 7,846,819 B2* | 12/2010 | Pribat et al. ................ | 438/479 |
| 7,879,734 B2* | 2/2011 | Fukutani et al. ............ | 438/745 |
| 8,030,185 B2* | 10/2011 | Chen et al. ................. | 438/478 |
| 8,038,887 B2* | 10/2011 | Bakajin et al. ............. | 210/652 |
| 8,337,979 B2* | 12/2012 | Wardle et al. .............. | 428/297.4 |
| 2003/0165418 A1* | 9/2003 | Ajayan et al. ............... | 423/447.2 |
| 2004/0023372 A1* | 2/2004 | Klein et al. ................. | 435/317.1 |
| 2004/0033339 A1* | 2/2004 | Fukutani et al. ............ | 428/137 |
| 2005/0269743 A1* | 12/2005 | Kroupenkine et al. ..... | 264/291 |
| 2006/0111008 A1* | 5/2006 | Arthur et al. ............... | 445/46 |
| 2006/0148370 A1* | 7/2006 | Kadono et al. ............. | 445/51 |

(Continued)

FOREIGN PATENT DOCUMENTS

| | | |
|---|---|---|
| JP | 2003-205499 A | 7/2003 |
| KR | 1020020088027 A | 11/2002 |

(Continued)

*Primary Examiner* — Laura Menz
(74) *Attorney, Agent, or Firm* — Cantor Colburn LLP

(57) ABSTRACT

Provided are a porous nanostructure and a method of manufacturing the same. The porous nanostructure includes a plurality of pores disposed on an exterior surface of a nanostructure, wherein at least a portion of the plurality of pores extend inside the nanostructure.

6 Claims, 2 Drawing Sheets

(56) References Cited

U.S. PATENT DOCUMENTS

| | | | |
|---|---|---|---|
| 2006/0192309 A1* | 8/2006 | Fukutani et al. | 264/1.21 |
| 2007/0001220 A1* | 1/2007 | Tombler et al. | 257/330 |
| 2007/0105240 A1* | 5/2007 | Kempa et al. | 438/3 |
| 2008/0075954 A1* | 3/2008 | Wardle et al. | 428/339 |
| 2008/0170982 A1* | 7/2008 | Zhang et al. | 423/447.3 |
| 2008/0223795 A1* | 9/2008 | Bakajin et al. | 210/767 |
| 2008/0236473 A1* | 10/2008 | Kornblit et al. | 114/67 R |
| 2009/0050204 A1* | 2/2009 | Habib | 136/261 |
| 2009/0311166 A1* | 12/2009 | Hart et al. | 423/445 B |
| 2010/0021650 A1* | 1/2010 | Kadono et al. | 427/534 |
| 2010/0059736 A1* | 3/2010 | Tombler, Jr. | 257/14 |
| 2010/0068808 A1* | 3/2010 | Bangera et al. | 435/375 |
| 2010/0163841 A1* | 7/2010 | Chen et al. | 257/14 |
| 2010/0173070 A1* | 7/2010 | Niu | 427/215 |
| 2010/0200199 A1* | 8/2010 | Habib et al. | 165/104.26 |
| 2010/0278715 A1* | 11/2010 | Khe | 423/447.1 |
| 2010/0295023 A1* | 11/2010 | Franklin et al. | 257/24 |
| 2010/0303722 A1* | 12/2010 | Jin et al. | 424/9.1 |
| 2010/0313953 A1* | 12/2010 | Zook et al. | 136/259 |
| 2011/0039690 A1* | 2/2011 | Niu | 502/184 |
| 2011/0133153 A1* | 6/2011 | Lee et al. | 257/9 |
| 2011/0177154 A1* | 7/2011 | Bangera et al. | 424/450 |
| 2011/0266521 A1* | 11/2011 | Ferrari et al. | 257/14 |
| 2011/0300222 A1* | 12/2011 | Sailor et al. | 424/493 |
| 2012/0129682 A1* | 5/2012 | Yun et al. | 502/5 |
| 2012/0202347 A1* | 8/2012 | Ready et al. | 438/666 |
| 2012/0264034 A1* | 10/2012 | Waki et al. | 429/482 |

FOREIGN PATENT DOCUMENTS

| | | |
|---|---|---|
| KR | 10-0738651 B1 | 7/2007 |
| KR | 10-0801192 B1 | 1/2008 |
| KR | 1020090011098 A | 2/2009 |
| KR | 1020090064908 A | 6/2009 |

* cited by examiner

POROUS NANOSTRUCTURE AND METHOD OF MANUFACTURING THE SAME

CROSS-REFERENCE TO RELATED APPLICATION

This application claims priority to Korean Patent Application No. 10-2009-0121410, filed on Dec. 8, 2009, and all the benefits accruing therefrom under 35 U.S.C. §119, the content of which in its entirety is herein incorporated by reference.

BACKGROUND

1. Field

The present disclosure generally relates to a porous nanostructure and a method of manufacturing the same.

2. Description of the Related Art

Unlike bulk materials, a nanowire has a relatively large surface area with respect to its volume, and this property of nanowires may be applied to various fields. Therefore, nanowires are the subject of much research in the field of nanotechnology. For example, nanowires are being researched in fields regarding optical nano devices, such as lasers, electric nano-devices, such as transistors, memories, nanosensors, and various other similar devices.

A nanowire has substantially uniform characteristics, may be fabricated to have any of a variety diameters, and its physical and electrical characteristics may be changed based on its surface characteristics. Electrons may be scattered or trapped on a surface of a nanowires when electrons or phonons are transmitted through the nanowires. A nanowire may be formed of any of a variety of materials, such as silicon, tin oxides, gallium nitride (a light-emitting semiconductor), or other similar materials. Currently, it is possible to adjust the length and the thickness of a nanowire.

A general method for fabricating a nanowire includes a vapor-liquid-solid ("VLS") growth method. According to the VLS growth method, a nanowire may be grown by forming and melting an alloy of a nanowire material and a metal catalyst and extracting the nanowire material from between the melted liquid alloy and a solid substrate.

SUMMARY

According to an aspect of the present disclosure, an embodiment of a porous nanostructure includes a plurality of pores disposed on an exterior surface of a nanostructure, wherein at least a portion of the plurality of pores extend inside the nanostructure.

In one embodiment, the pores may be via holes which penetrate the nanostructure.

In one embodiment, the nanostructure may be at least one of a nanotube and a nanowire.

In one embodiment, the nanostructure may be formed of IV family semiconductors, III-V family semiconductors, II-VI family semiconductors, oxide semiconductors, nitride semiconductors, or a VI family element and at least one of IV family elements and V family elements.

In one embodiment, the nanostructure may include at least one of a p-type impurity and an n-type impurity.

According to another aspect of the present disclosure, an embodiment of a method of manufacturing a porous nanostructure, the method includes attaching nanoparticles to a surface of a nanostructure; forming an oxide material on the surface of the nanostructure by oxidizing the nanostructure; and forming pores by removing the oxide material and the nanoparticles.

In one embodiment, the nanoparticles may be formed of a metal exhibiting higher electronegativity than that of a material constituting the nanostructure.

In one embodiment, the nanostructure may be formed of silicon, and the nanoparticles may be formed of Ag, Au, Pu, or Cu.

In one embodiment, the nanostructure may be formed of silicon, and the nanostructure may be oxidized using $H_2O_2$, $K_2Cr_2O_7$, or $KMnO_4$.

In the attaching of the nanoparticles to the surface of the nanostructure, the nanoparticles may be formed on the surface of the nanostructure by dipping the nanostructure in a solution in which a metal precursor and a fluoric acid are mixed.

In one embodiment, the attaching of the nanoparticles to the surface of the nanostructure may include removing an oxide layer from the surface of the nanostructure; and attaching nanoparticles formed of a material that forms a compound with a material constituting the nanostructure to the surface of the nanostructure.

In one embodiment, the nanostructure may be oxidized through at least one of a wet oxidization process using $H_2O$ gas and a dry oxidization process using $O_2$ gas.

In one embodiment, the at least one of a wet oxidization process and a dry oxidization process may be performed at a temperature of about 600° C. to about 1,100° C.

In one embodiment, the nanostructure may be formed of silicon, and the nanoparticles may form metal silicide together with the material constituting the nanostructure.

BRIEF DESCRIPTION OF THE DRAWINGS

These and/or other aspects will become apparent and more readily appreciated from the following description of the embodiments, taken in conjunction with the accompanying drawings of which:

FIG. 2B is a diagram showing an embodiment of a porous nanostructure in which a via hole (also referred to as a "through hole") is formed.

DETAILED DESCRIPTION

Figure 1A:
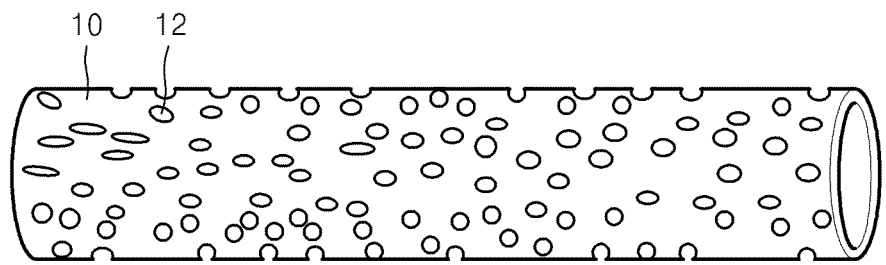
FIGS. 1A and 1B are diagrams of an embodiment of a porous nanostructure 10 according to the present disclosure.

Embodiments now will be described more fully hereinafter with reference to the accompanying drawings, in which embodiments are shown. These embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

Hereinafter, the embodiments will be described in detail with reference to the accompanying drawings.

Figure 1B:
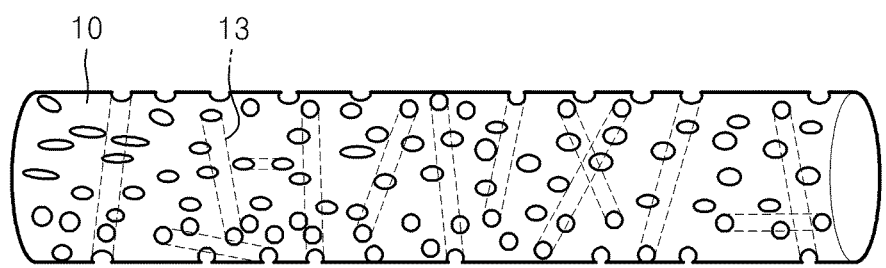

FIGS. 1A and 1B are diagrams of an embodiment of a porous nanostructure 10 according to the present disclosure.

FIG. 1A illustrates the nanostructure 10 and a plurality of pores 12 formed on a surface of the nanostructure 10, wherein the plurality of pores 12 extend into the nanostructure 10. Here, in the embodiment wherein the nanostructure 10 may be a nanotube, the plurality of pores 12 may be formed by completely penetrating a sidewall of the nanostructure 10, or where only a portion of the pores 12 may completely penetrate the sidewall of the nanostructure 10, and the other part of the pores 12 may only partially penetrate the sidewall of the nanostructure 10.

Furthermore, FIG. 1B illustrates the nanostructure 10 and a plurality of pores formed on the surface of the nanostructure 10 and formed into the nanostructure 10, wherein a portion of the plurality of pores may be via holes (also referred to as "through holes") 13. In detail, FIG. 1B illustrates that the nanostructure 10 is formed as a nanowire, the plurality of pores are formed on the surface of the nanowire into the nanowire, and at least a portion of the pores may extend toward the center of the nanowire and may be formed as the via holes 13; although the via holes 13 are not required to penetrate through a center of the nanowires, and instead may penetrate obliquely through the nanowire.

As described above, the nanostructure 10 may be a nanowire or a nanotube. The nanostructure 10 may be formed of any of a variety of materials. For example, the nanostructure 10 may be formed of IV family semiconductors, III-V family semiconductors, II-VI family semiconductors, oxide semiconductors, nitride semiconductors, or a VI family element and at least one of IV family elements and V family elements. Here, in one embodiment, the IV family semiconductors may include Si, Ge, and SiC, the III-V family semiconductors may include GaN, GaAs, and AsP, and the II-VI family semiconductors may include CdSe, CdS, and ZnS, for example. Furthermore, the oxide semiconductors may include ZnO, for example, and the nitride semiconductors may include silicon nitride or germanium nitride, for example. However, the present disclosure is not limited thereto. Furthermore, the nanostructure 10 may be doped with one of a p-type impurity or an n-type impurity. The length of the nanostructure 10 may be on a scale from about several nm to about several cm.

The plurality of pores 12 formed on the surface of the nanostructure 10 and extending into the nanostructure 10 may have any of various cross-sectional shapes, e.g. circular, elliptical, polygonal, tapered, conical or other similar shapes. Diameters of the pores 12 may be from about 0.1 nm to about several µm. However, the present disclosure is not limited thereto. The pores 12 may extend from the surface of the nanostructure 10 into the nanostructure 10 as described above. The pores 12 may penetrate the sidewall of the nanostructure 10 if the nanostructure 10 is a nanotube, or the pores 12 may completely penetrate the nanostructure 10 if the nanostructure 10 is a nanowire.

Hereinafter, an embodiment of a method of manufacturing an embodiment of a porous nanostructure according to the present disclosure will be described with reference to the drawings.

Figure 2A:
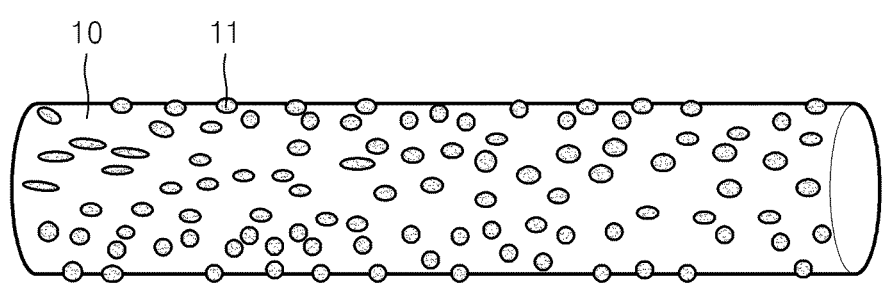
FIGS. 2A and 2B are diagrams showing an embodiment of a method of manufacturing an embodiment of a porous nanostructure according to the present disclosure.
Figure 2B:
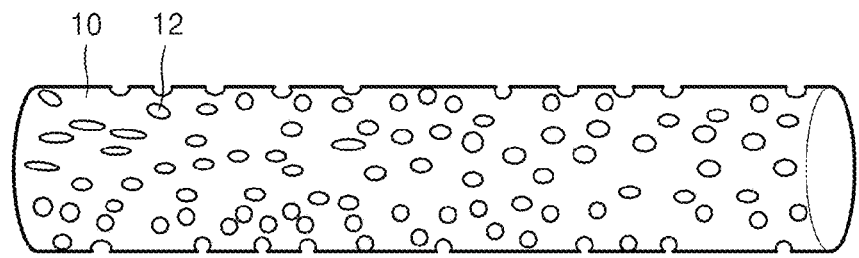

FIGS. 2A and 2B are diagrams showing an embodiment of a method of manufacturing an embodiment of a porous nanostructure according to the present disclosure.

Methods of forming a nanostructure will be described in an example below. First, a substrate is prepared, and a catalyst material layer is formed thereon. A catalyst material may be a metal, such as Au, Ni, Ag, Al, Fe, or other materials with similar characteristics. Then, a nanostructure may be grown on the catalyst material layer by supplying a Si source gas thereto, for example $SiH_4$. However, the present disclosure is not limited thereto, and a nanostructure may be formed using any of various methods.

An embodiment of a method of manufacturing a porous nanostructure according to the present disclosure may include operations for attaching nanoparticles to a nanostructure, oxidizing the nanostructure through an oxidization process, and forming a plurality of pores on a surface of and inside the nanostructure by etching and removing an oxide layer and the nanoparticles formed on the nanostructure.

Referring to FIG. 2A, nanoparticles 11 are attached to the surface of the nanostructure 10. The nanostructure 10 may be formed of IV family semiconductors, III-V family semiconductors, II-VI family semiconductors, oxide semiconductors, nitride semiconductors, or a VI family element and at least one of IV family elements and V family elements. In one embodiment, the nanoparticles 11 may be formed of a metal exhibiting higher electronegativity than that of the material constituting the nanostructure 10, so that the nanostructure 10 may be selectively oxidized through the oxidization process. For example, if the nanostructure 10 is formed of silicon, the nanoparticles 11 may be formed of Ag, Au, Pu, or Cu or other materials with similar characteristics. However, the present disclosure is not limited thereto. Then, when the nanostructure 10 is oxidized using an oxidizing agent, an oxide layer is formed on the surface of the nanostructure 10, and thus the nanoparticles 11 permeate into the nanostructure 10. If the nanostructure 10 is formed of silicon, the oxidizing agent may be $H_2O_2$, $K_2Cr_2O_7$, $KMnO_4$, or other materials with similar characteristics, which may induce oxidization of silicon. However, the present disclosure is not limited thereto, and any of various oxidizing agents may be used according to a raw material which constitutes the nanostructure 10.

Then, when the oxide layer and the nanoparticles 11 are removed from the surface of the nanostructure 10, pores 12 are formed where the nanoparticles 11 previously were, as shown in FIG. 2B. If the nanostructure 10 is formed of silicon, the oxide layer may be removed using a hydrofluoric acid solution. Embodiments include configurations wherein shapes and sizes of cross-sections of the pores 12 may vary based on shapes and sizes of the nanoparticles 11 attached to the surface of the nanostructure 10. Furthermore, depths of the pores 12 from the surface of the nanostructure 10 may be controlled through controlling periods of elapsed times for oxidization and etching processes.

Instead of directly attaching the nanoparticles 11 to the surface of the nanostructure 10, the nanoparticles 11 may be formed on the surface of the nanostructure 10 using a metal precursor, as will be described below.

For example, if the nanostructure 10 is grown on a silicon material, when the nanostructure 10 is dipped in a solution in which $AgNO_3$ and a fluoric acid material are mixed, and an electroless deposition process is performed, Ag nanoparticles, which are formed as the nanoparticles 11, are formed on the surface of the nanostructure 10. Here, if an oxidizing agent is added thereto, the nanostructure 10 is oxidized and the nanoparticles 11 permeate into the nanostructure 10. Then, when the oxidized region of the nanostructure 10 and the nanoparticles 11 on the surface of the nanostructure 10 are removed, pores 12 may be formed on the surface of, and extending into, the nanostructure 10 as described above.

In one embodiment, the process described above may be performed at room temperature, and, in the oxidization process or the etching process, an oxidizing agent or an etching material may be selected based on the material constituting the nanostructure 10. An embodiment of a process of forming pores in the nanostructure 10 through an oxidization process using an oxidizing gas at a high temperature will be described below.

First, a natural oxide layer formed on the surface of the nanostructure 10, e.g., an oxide layer which may be formed via exposure to an air environment, is etched and removed, and then nanoparticles are attached to the surface of the nanostructure 10. Then, an oxidizing gas is supplied at a temperature between about 600° C. to about 1,100° C. to oxidize the surface of the nanostructure 10. At this point, if the surface of the nanostructure 10 is oxidized at a relatively fast rate, an oxide layer is formed into the nanostructure 10 in portions of the surface of the nanostructure 10 exposed between the nanoparticles 11. Therefore, when removing an oxide layer on the surface of the nanostructure 10 through an etching process, portions of the surface of the nanostructure 10 on which the nanoparticles 11 are disposed protrude, and the other portions of the surface of the nanostructure 10 from which the natural oxide layer is removed are sunken. After the natural oxide layer is removed, the nanoparticles are also etched and removed. That is, the portions where nanoparticles 11 are formed are not oxidized or very slowly oxidized because the nanoparticles 11 may act as a mask to block the oxidizing gas. Oxide film may not be formed under the nanoparticles 11. Thus, when removing an oxide layer on the surface of the nanostructure 10 through an etching process, portions of the surface of the nanostructure 10 on which the nanoparticles 11 are disposed protrude.

A method of forming a porous nanostructure in the embodiment where the nanoparticles 11 are formed of a material that may form a compound with the material constituting the nanostructure 10 will be described below. After the natural oxide layer on the surface of the nanostructure 10 is removed using a fluoric acid material, a wet oxidization process using $H_2O$ gas or a dry oxidization process using $O_2$ gas may be performed at a temperature between about 600° C. to about 1,100° C., for example. It is easy to form an uneven structure on the surface of the nanostructure 10 via a dry oxidization process since oxidization is slower in the dry oxidization process. The nanoparticles 11 may be formed of a material that may form a compound with the material constituting the nanostructure 10. For example, if the nanostructure 10 is formed of silicon, the nanoparticles 11 may be formed of a material capable of forming a metal silicide, such as Au, Ni, Co, or other material with similar characteristics. In a high-temperature oxidization process, if the nanoparticles 11 are formed of Au, oxidized materials are formed in portions of the surface of the nanostructure 10 on which the nanoparticles 11 are not formed, and a metal silicide grows into the nanostructure 10 in portions of the surface of the nanostructure 10 on which the nanoparticles 11 are formed. Since the growth of the metal silicide is faster than the formation of the oxide layer, the metal silicide is formed deeper inside the nanostructure 10 than the thickness of the oxide layer. When the oxide material and the metal silicide are removed, regions in which the metal silicide was formed become deep pores.

Through the process as described above, pores 12 may be formed on the surface of the nanostructure 10 and inside the nanostructure 10, and, as more time is taken for the processes, such as the oxidization process, the depth of the pores 12 may increase. In this manner, the via holes 13, which completely penetrate the nanostructure 10, may also be formed.

Figure 3A:
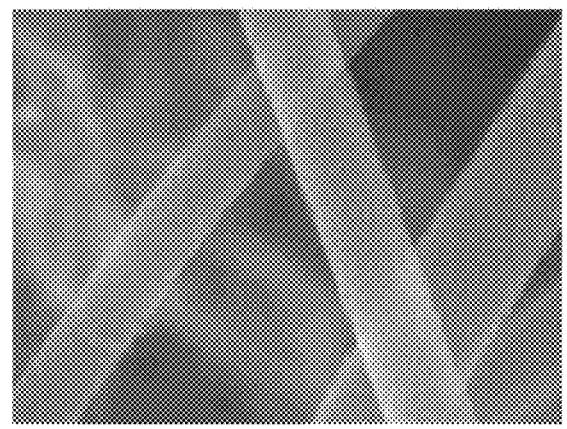
FIGS. 3A and 3B are scanning electron microscopic ("SEM") images of an embodiment of a porous nanostructure.
Figure 3B:
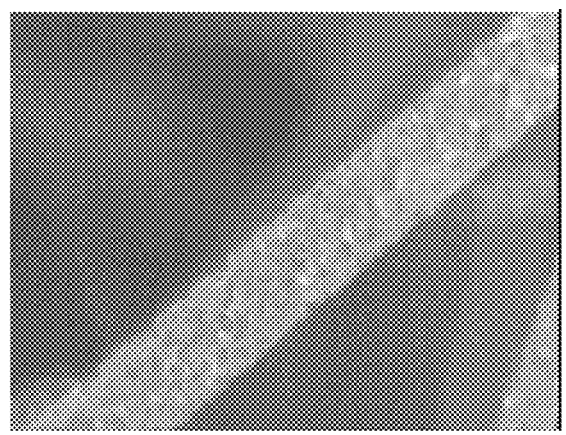

FIGS. 3A and 3B are scanning electron microscopic ("SEM") images of a porous nanostructure. Referring to FIGS. 3A and 3B, fine pores formed on the surface of a nanowire may be seen. Sizes and density of the pores formed on the surface of a nanostructure may be easily controlled by modifying a material forming the uneven structure and a processing time thereof.

As described above, according to the one or more of the above embodiments of the present disclosure, a nanostructure having pores formed on the surface of and inside the same and a method of fabricating the same may be provided. A porous nanostructure may be used in a high performance thermoelectric device, because thermal conduction may be reduced by pores formed on the surface of and inside the porous nanostructure. Furthermore, since the surface area of the nanostructure may be significantly increased by forming pores, the porous nanostructure may be widely used in energy-related fields, such as solar-cells. Furthermore, due to a quantization effect of a porous surface, the core-shell nanowire may be used in a light emitting device or a light receiving device.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A porous nanostructure comprising:
   a plurality of pores that intersect with an exterior circumferential surface of a nanostructure, wherein at least a portion of the plurality of pores are via holes which entirely penetrate a center of the nanostructure and intersect with the exterior circumference at at least two points that lie along a straight line, the via holes defined by the nanostructure itself,
   wherein the nanostructure is a nanowire.

2. A porous nanostructure comprising:
   a plurality of pores that intersect with an exterior circumferential surface of a nanostructure, wherein at least a portion of the plurality of pores are via holes which entirely penetrate a sidewall of the nanostructure and intersect with the exterior circumference at at least two points that lie along a straight line, the via holes defined by the nanostructure itself,
   wherein the nanostructure is a nanotube.

3. The porous nanostructure of claim 1, wherein the nanostructure includes at least one of IV family semiconductors, III-V family semiconductors, II-VI family semiconductors, oxide semiconductors, nitride semiconductors, and a VI family element and at least one of IV family elements and V family elements.

4. The porous nanostructure of claim 1, wherein the nanostructure comprises at least one of a p-type impurity and an n-type impurity.

5. The porous nanostructure of claim 2, wherein the nanostructure includes at
   least one of IV family semiconductors, III-V family semiconductors, II-VI family semiconductors, oxide semiconductors, nitride semiconductors, and a VI family element and at least one of IV family elements and V family elements.

6. The porous nanostructure of claim 2, wherein the nanostructure comprises
   at least one of a p-type impurity and an n-type impurity.

* * * * *